United States Patent
Jalan et al.

(10) Patent No.: US 9,904,595 B1
(45) Date of Patent: Feb. 27, 2018

(54) ERROR CORRECTION HARDWARE WITH FAULT DETECTION

(71) Applicant: Texas Instruments Incorporated, Dallas, TX (US)

(72) Inventors: Saket Jalan, Karnataka (IN); Indu Prathapan, Karnataka (IN); Abhishek Ganapati Karkisaval, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/244,739

(22) Filed: Aug. 23, 2016

(51) Int. Cl.
G06F 11/00 (2006.01)
G06F 11/10 (2006.01)
G11C 29/52 (2006.01)
G06F 3/06 (2006.01)

(52) U.S. Cl.
CPC .......... G06F 11/1068 (2013.01); G06F 3/064 (2013.01); G06F 3/0619 (2013.01); G06F 3/0673 (2013.01); G11C 29/52 (2013.01)

(58) Field of Classification Search
CPC ..... G06F 11/1068; G06F 3/0619; G06F 3/064
See application file for complete search history.

(56) References Cited

U.S. PATENT DOCUMENTS

| | | | |
|---|---|---|---|
| 5,488,691 A | 1/1996 | Fuoco et al. | |
| 8,612,814 B1 * | 12/2013 | Tan | G11C 29/44 714/732 |
| 9,081,588 B2 | 7/2015 | Ross et al. | |
| 9,684,560 B2 * | 6/2017 | Thatcher | G06F 11/1068 |
| 9,710,318 B2 * | 7/2017 | Xiao | G06F 9/30076 |
| 9,727,415 B2 * | 8/2017 | Geng | G06F 11/1068 |
| 9,734,010 B2 * | 8/2017 | Mittelholzer | G06F 11/1068 |
| 2003/0009721 A1 | 1/2003 | Hsu et al. | |
| 2003/0088805 A1 | 5/2003 | Majni et al. | |
| 2009/0055602 A1 | 2/2009 | von Wendorff | |
| 2009/0183052 A1 * | 7/2009 | Kanno | G06F 11/1068 714/763 |
| 2012/0221919 A1 * | 8/2012 | Ekas | G06F 11/1048 714/758 |
| 2015/0212881 A1 * | 7/2015 | Conte | G06F 11/1068 714/764 |
| 2015/0278012 A1 | 10/2015 | Gjorup | |

FOREIGN PATENT DOCUMENTS

WO 2015160859 10/2015

* cited by examiner

*Primary Examiner* — Esaw Abraham
(74) *Attorney, Agent, or Firm* — Ronald O. Neerings; Charles A. Brill; Frank D. Cimino

(57) ABSTRACT

Error correction code (ECC) hardware includes write generation (Gen) ECC logic and a check ECC block coupled to an ECC output of a memory circuit with read Gen ECC logic coupled to an XOR circuit that outputs a syndrome signal to a syndrome decode block coupled to a single bit error correction block. A first MUX receives the write data is in series with an input to the write Gen ECC logic or a second MUX receives the read data from the memory circuit in series with an input of the read Gen ECC logic. A cross-coupling connector couples the read data from the memory circuit to a second input of the first MUX or for coupling the write data to a second input of the second MUX. An ECC bit comparator compares an output of the write Gen ECC logic to the read Gen ECC logic output.

15 Claims, 4 Drawing Sheets

ERROR CORRECTION HARDWARE WITH FAULT DETECTION

FIELD

Disclosed embodiments relate to Error Correction Circuits (ECCs), and more particularly to hardware for fault detection of ECC logic circuitry.

BACKGROUND

Error correction code (ECC) memory is a type of computer data storage that can detect and correct most conventional types of internal data corruption. ECC memory circuits may be used in computers where data corruption cannot generally be tolerated, such as for scientific or for automotive memories for safety critical Advanced Driver Assistance Systems (ADAS) which need to comply with functional safety requirements.

Implementing ECC on memories (e.g., static random access memory (SRAM), read only memory (ROM), or flash memory) is a standard safety mechanism used in safety critical applications to ensure data integrity within the memories. Conventionally, ECC redundant bits (e.g., in a Hamming code) are added to the memory data contents by write path ECC logic circuitry and written together in the same cycle to the memory in order to provide checking of the data stored in the memory when the memory is read out by read path ECC logic circuitry. The ECC as used herein is for single bit error correction for single bit errors and a multi-bit error detection for multi-bit errors (e.g., double bit errors), generally using redundant bits in a Hamming code.

Conventionally generate ECC hardware units are provided in the write path and in the read path, with a generate ECC unit in the write path and a check ECC block including another generate ECC unit in the read path. The write path circuitry and read path circuitry have no cross coupling connections and thus operate independently from one another. During a memory read operation, the ECC is re-recomputed by the check ECC block which is compared with the stored ECC by an XOR circuit. The result (output) of this XOR circuit is called the syndrome. If the syndrome is zero, no error has occurred. If the syndrome is non-zero, it can be used to index a table to a "Syndrome decode" to determine which bits are in error in case of a single bit error correction (SEC), or that the error is uncorrectable in case of a double bit error detection (DED). Accordingly, conventional ECC memory can generally maintain a memory system effectively free from most bit errors.

SUMMARY

This Summary briefly indicates the nature and substance of this Disclosure. It is submitted with the understanding that it will not be used to interpret or limit the scope or meaning of the claims.

Disclosed embodiments recognize there can be transient or permanent errors in the ECC logic hardware of ECC memory circuits in the write side which can result in wrong ECC bits being written into the memory during the write operation. Transient or permanent errors in the ECC logic hardware in the read side of ECC memory circuits can result in corruption of memory read data or in the wrong flagging of memory read data as corrupted when the read data is in fact not corrupted. Although it may be possible to detect transient/permanent errors in the ECC logic of ECC memory circuits, because the write path circuitry and read path circuitry are only known to operate independently this would require significant additional logic to implement including the need for extra ECC generation logic on both sides of the ECC memory circuit.

Disclosed embodiments solve this problem by providing lockstep ECC circuit hardware comprising an error correction circuit that utilizes cross-coupled connections between the write path circuitry and read path circuitry which enables the reuse of ECC generation logic on one side of the memory circuit to check for errors on the other side thus reducing the ECC logic requirement and saving significant semiconductor chip area. Disclosed embodiments include a method of fault detection for ECC circuitry for a memory circuit having write generation (Gen) ECC logic in a write path circuitry and check ECC logic including read Gen ECC logic in read path circuitry. An output of the read Gen ECC logic and an output of the write Gen ECC logic are compared by a digital comparator to check whether the respective bits strings match. A fault in the write Gen ECC logic or in the read Gen ECC logic is recognized when the bits strings do not match. In case of a lockstep error (mismatch in comparator output) during the write operation, the write operation can be repeated. In case of a lockstep error during the read operation, the single bit errors can be corrected and a multi-bit error interrupt signal sent.

BRIEF DESCRIPTION OF THE DRAWINGS

Reference will now be made to the accompanying drawings, which are not necessarily drawn to scale, wherein.

DETAILED DESCRIPTION

Figure 1:
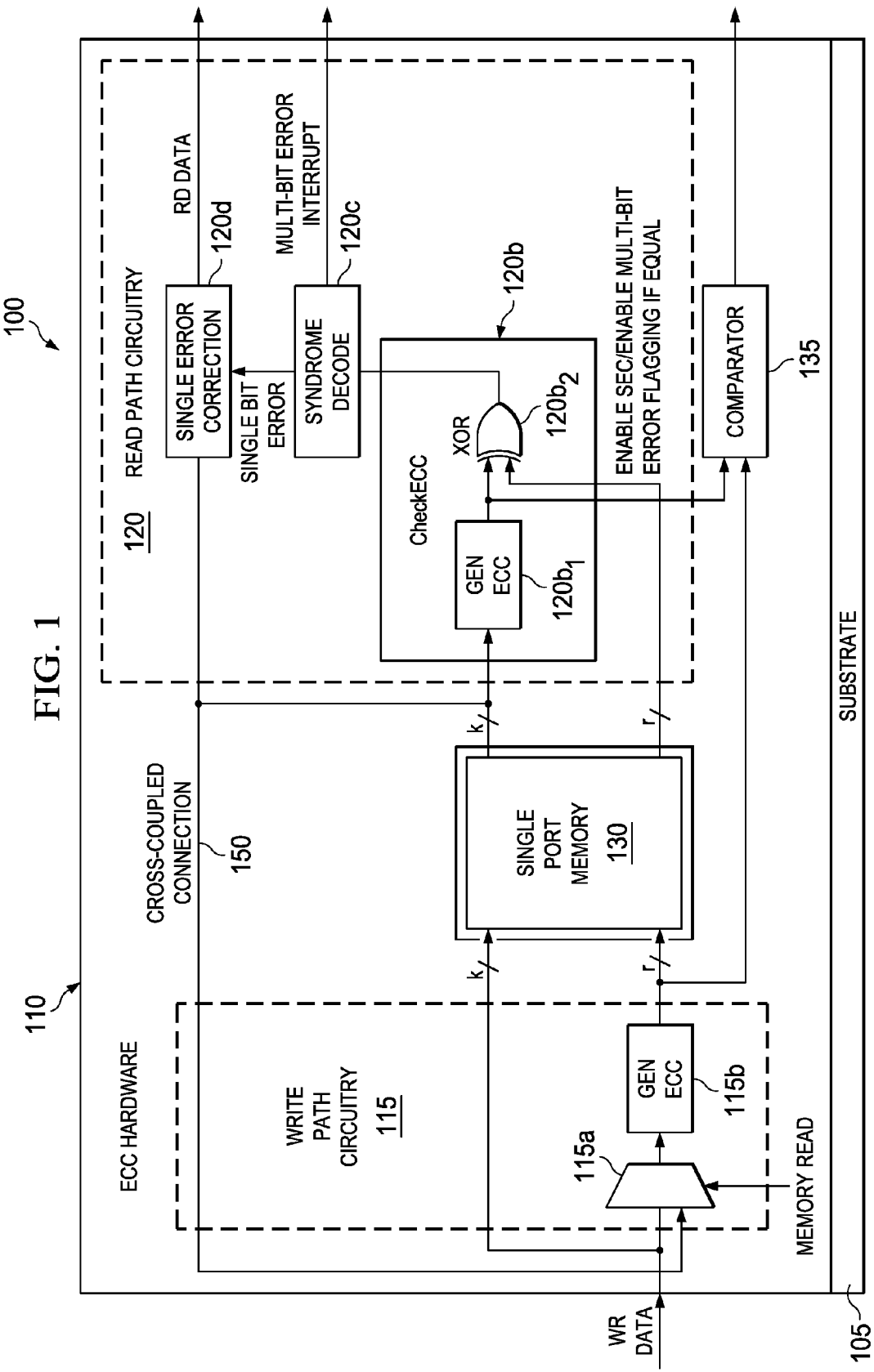
FIG. 1 is a block diagram of an example ECC memory circuit having disclosed lockstep ECC circuit hardware for fault detection in the read side ECC logic having a multiplexer with a first input for receiving write data in series with an input to the ECC generation logic, according to an example embodiment. Write data is selected during a normal write operation and read data is selected during the read operation.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 2:
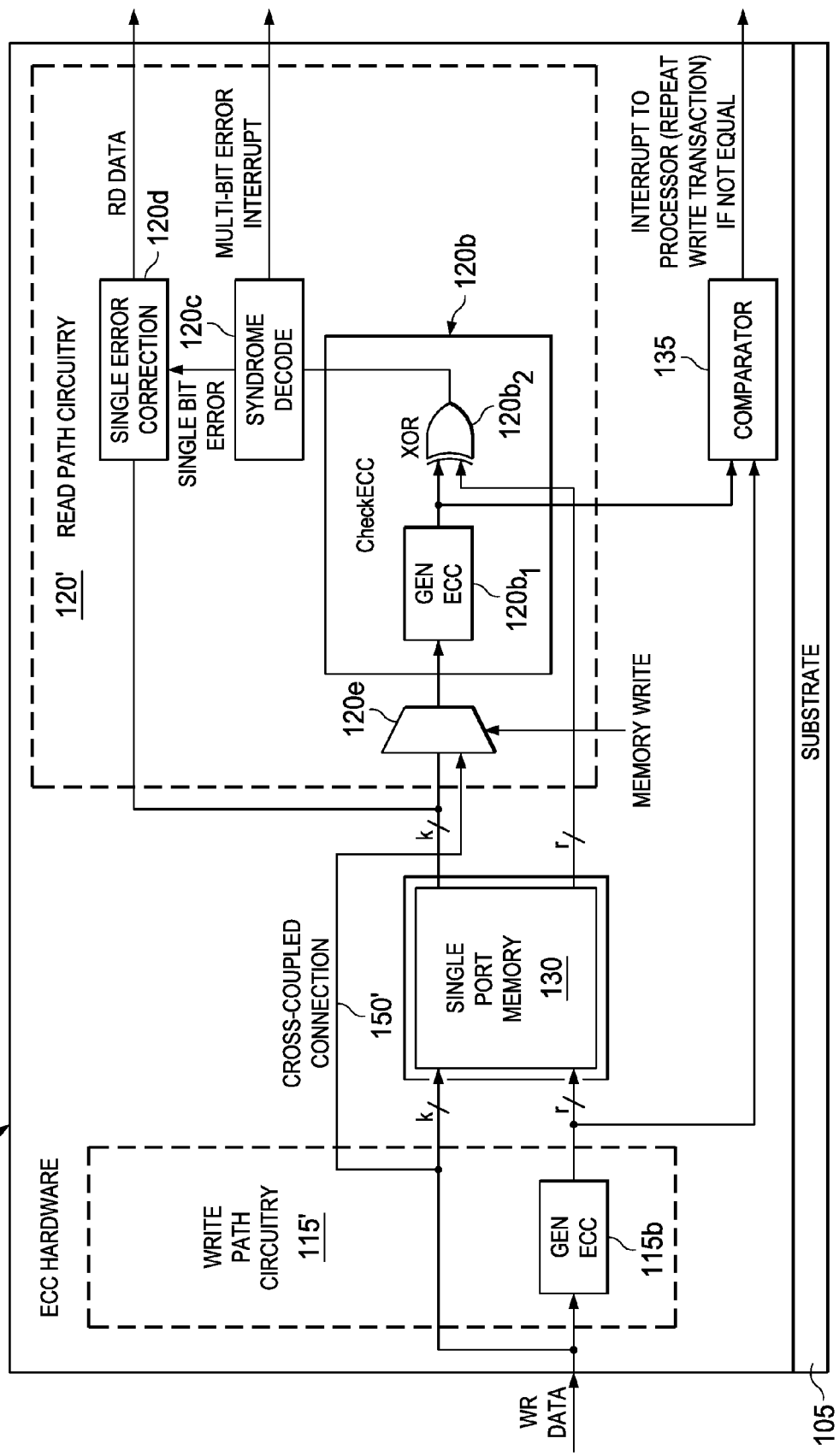
FIG. 2 is a block diagram of another example ECC memory circuit having disclosed lockstep ECC circuit hardware for fault detection in write side ECC logic having a multiplexer with a first input for receiving the read data from the memory circuit in series with an input of the Gen ECC logic for fault detection in the ECC logic, according to an example embodiment.

FIG. 1 shows an ECC memory circuit 100 including a memory circuit 130 (e.g., SRAM, ROM, or a flash memory chip) and disclosed "lockstep" ECC hardware 110 having fault detection in its ECC logic circuitry configured for verifying the bit output of the read path Gen ECC $120b_1$ in the read path circuitry 120. The memory circuit 130 comprises a single port memory where only one operation (read or write) can be performed for a given clock pulse. This single port memory feature is recognized to enable the bit output from one of the ECC GEN logics (the side that is not active at the particular time/clock, write not being active as shown in FIG. 1, and read not being active as shown in FIG. 2) to be available as a reference to enable disclosed lockstep error detection.

The memory circuit 130 includes a common substrate 105 having at least a semiconductor surface. For example, the substrate 105 can comprise a bulk silicon substrate, or an epitaxial layer on a bulk silicon substrate.

The memory circuit 130 has a separate data output and a separate ECC output. Data shown as k bits is stored along with ECC bits shown as r bits. For example, if a non-ECC memory stores 64 bits of data, then an ECC memory will store the same 64 bits of data with an extra 8 bits of ECC. Hence 64+8 bits are written and 64+8 bits are read out. The ECC 8 bits are used to validate the 64 data bits, and goes to the XOR logic in the Check ECC.

There is write Generation (Gen) ECC logic 115b in a write path circuitry 115 and check ECC logic 120b including read Gen ECC logic $120b_1$ in the read path circuitry 120. While operating in the write mode (write mode is active in FIG. 2 described below), data bits (shown as WR data, for example 64 bits) and the corresponding computed ECC bits (for example 8 bits) from the write ECC Gen logic 115b are each written into the memory circuit 100 in the same clock cycle. In FIGS. 1 and 2 the data width for the memory circuit 130 can in one example be 72 bits (72 bit wide memory) including 64 bits (data)+8 bits (ECC), which can be realized as two separate memories of width 64 and width 8, or be a single 72 bit wide memory.

As noted above 64 information/data bits and 8 ECC bits are only examples. The actual number of ECC bits can be based on the corresponding bit width for data (information), such as given in the example below:

| Number of Information Bits k | r bits for SEC-DED |
|---|---|
| 1 | 3 |
| 2 to 4 | 4 |
| 5 to 11 | 5 |
| 12 to 26 | 6 |
| 27 to 57 | 7 |
| 58 to 120 | 8 |
| 121 to 247 | 9 |
| 248 to 502 | 10 |

A multiplexer (Mux) 115a is provided at the input of write GEN ECC logic 115b to multiplex in cross-coupled read data provided by cross-coupled connection 150 shown as k bits from the memory circuit 130 with the write (wr) data generally from a processor. The processor can comprise a microprocessor, digital signal processor (DSP), or a microcontroller unit (MCU). The Mux 115a is shown having a select line that is shown based on the memory circuit 130 being in the read mode from a processor which is used to select which of the input lines comprising the rd data from the memory on one line and the wr data on the other line to send to the Mux's 115a output. When in the read mode, the rd data is selected by Mux 115a, while when in the write mode, the wr data is selected.

A digital comparator 135 is coupled to receive at one input the output from write Gen ECC logic 115b (as a reference as it is inactive during reading) and at its other output the output of the read path Gen ECC $120b_1$. Digital comparator 135 thus reuses the output from write Gen ECC logic 115b for verifying the bit output of the read path Gen ECC 120b1, both shown only as an example as being 8 bits. Read Gen ECC 120b1 together with an XOR circuit 120b2 constitute the check ECC block 120b. The output of the XOR circuit 120b2 provides "syndrome" signal to the syndrome decode block 120c. If the syndrome is zero, no error has occurred. If the syndrome is non-zero, the syndrome decode block 120c determines which bits are in error (SEC), or that the error is uncorrectable (e.g., the error is a double bit error). Single bit errors are provided to the SEC block 120d which outputs corrected read data shown as rd data.

For ECC hardware 110, the output of the digital comparator 135 is connected as an enable to the multi-bit (2 or more) error interrupt generation and as an enable to the SEC block 120d. Thus SEC of memory read data by SEC block 120d and multi-bit error flagging using the syndrome computation provided by syndrome decode 120c are both enabled by the enable signal from the digital comparator 135 if and only if the ECC computations in the write path and the ECC computations in the read path match one another (shown in FIG. 1 as the same r bits). If the ECC computations in the write path and the ECC computations in the read path do not match one another so that a lockstep error exists during read operation, and single bit errors can be corrected and in the case of a multi-bit errors such as double bit errors, a bit error interrupt (disable) signal can be sent.

FIG. 2 shows an example ECC memory circuit 200 including disclosed ECC hardware 110' for fault detection in its write path including write Gen ECC logic 115b, where a MUX 120e is added in the read path circuitry 120' and a cross-coupled connection 150' is added from the write path circuitry 115' to the MUX 120e in the read path circuitry 120' to mux the write data to data read from the memory circuit 130. Here the disclosed lockstep ECC hardware 110 having fault detection in its ECC logic circuitry is configured for verifying the bit output of the write Gen ECC logic 115b while the write mode is active. A control input shown as a "memory write" is the control signal which controls the MUX's 120e input selection node. When in the write mode, the wr data is selected by MUX 120e, while when in the read mode, the rd data is selected.

ECC bits output by the read Gen ECC logic 120b1 is used to verify operation of the write Gen ECC logic 115b by digital comparator 135 which compares the ECC bits generated by the respective Gen ECC logics 115b and 120$b_1$. The output of the digital comparator 135 that is generated is used as an interrupt to a processor (e.g., a microprocessor, digital signal processor (DSP), or a microcontroller unit (MCU)) to repeat the write transaction. In case of an error being flagged by the digital comparator 135 during a write operation, the write operation can be repeated to ensure that the data written into the memory circuit 130 is not in error. Repeating the write will generally fix the hardware error problem if the error is a transient fault. In case of a permanent fault, the digital comparator 135 will again keep generating an error in which case the processor can take appropriate action such as indicating to the application software that a permanent fault has occurred in the system. This same fault response is true in case of a read operation also.

Figure 3:
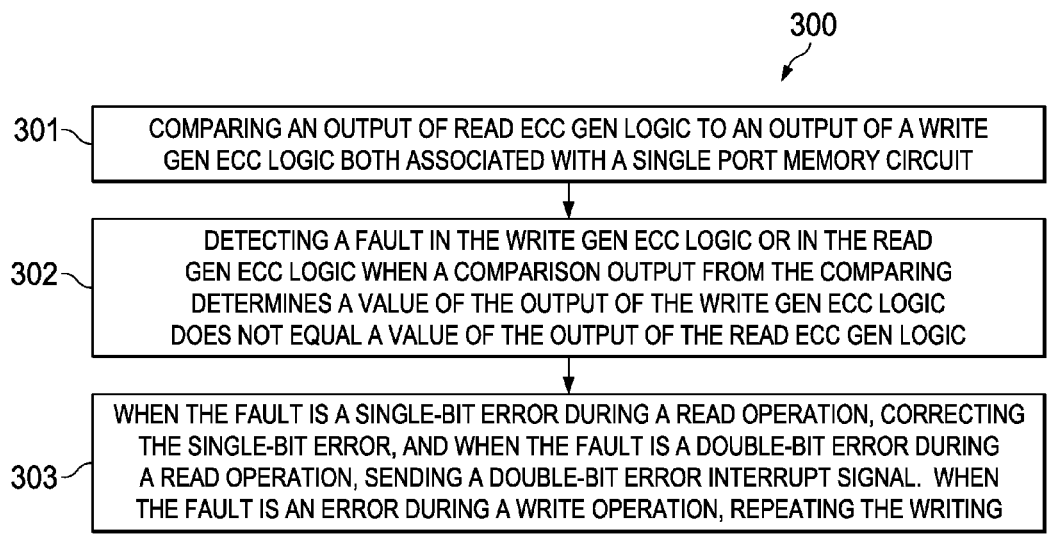
FIG. 3 is a flow chart that shows steps in an example method of fault detection for ECC circuitry, according to an example embodiment.

FIG. 3 is a flow chart that shows steps in an example method 300 of fault detection for ECC circuitry associated with a single port memory circuit, according to an example embodiment. Step 301 comprises comparing an output of read Gen ECC logic (120$b_1$ in FIG. 1 and FIG. 2) to an output of a write Gen ECC logic (115b in FIG. 1 and FIG. 2). Step 302 comprises detecting a fault in the write Gen ECC logic or in the read Gen ECC logic when a comparison output from the comparing determines a value of the output of the write Gen ECC logic does not equal a value of the output of the read Gen ECC logic 120$b_1$.

Step 103 comprises when the fault is a single-bit error during a read operation, correcting the single-bit error, and when the fault is a multi-bit error during a read operation, sending a multi-bit error interrupt signal. When the fault is an error during a write operation, repeating the writing. As described above for memory circuit 100 in FIG. 1 implementing fault detection in the read side, single bit errors are provided to the SEC block 120d which outputs corrected read data shown as rd data. As described above for memory circuit 200 in FIG. 2 implementing fault detection in the write side, the write operation can be repeated to ensure that the data written into the memory chip is not in error.

The embodiments described above relative to FIG. 1 (write side error checking) and FIG. 2 (read side error checking) may be independently practiced (one without the other) to detect errors on one side of the memory circuit 130. Alternatively, the read side and write side error checking embodiments described above relative to FIG. 1 and FIG. 2 may be combined together to enable error checking on both sides of the memory circuit 130.

Figure 4:
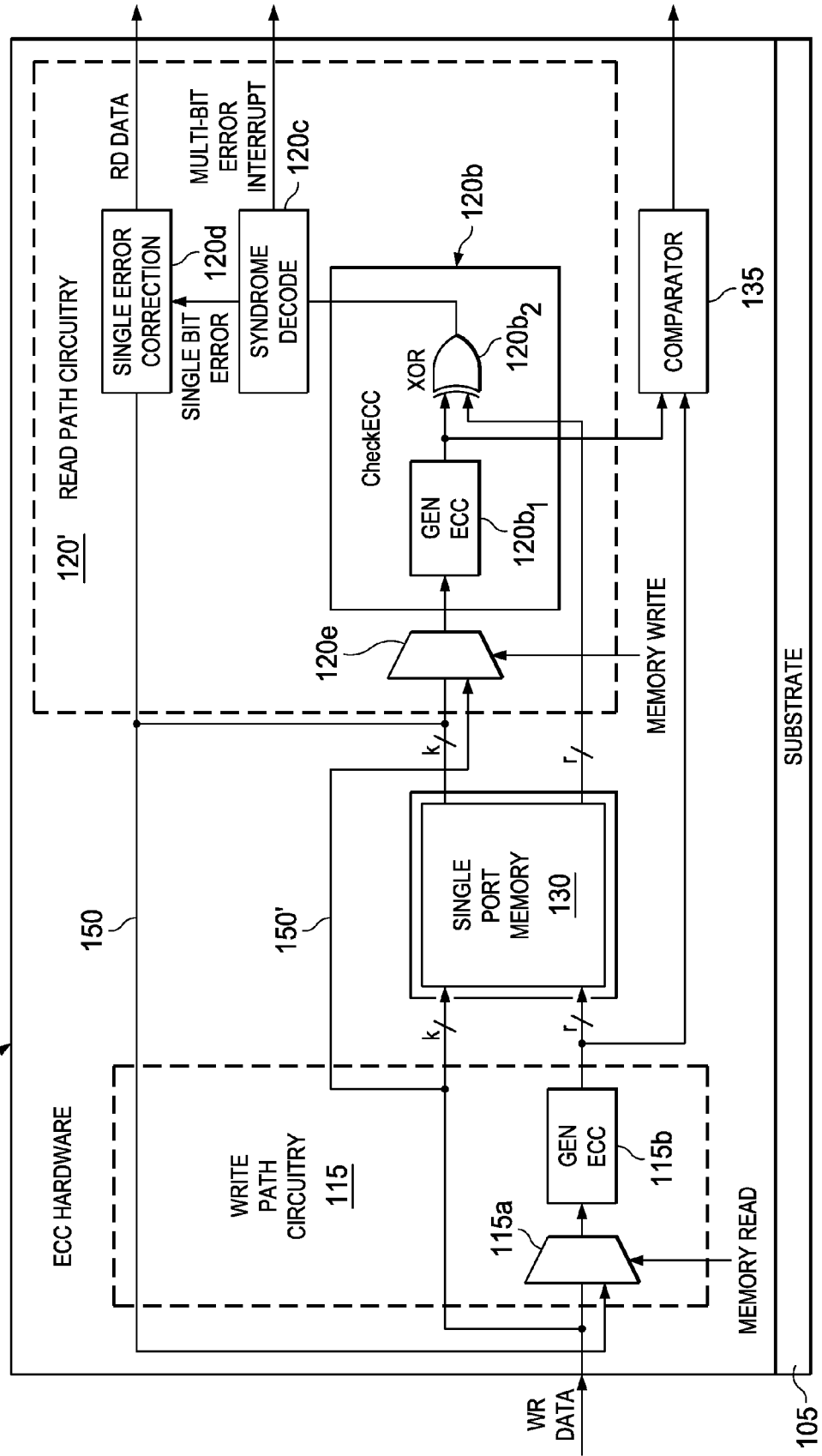
FIG. 4 is example ECC memory circuit including disclosed ECC hardware for fault detection in its read path and write path that essentially combines the read side and write side error checking embodiments described above relative to FIG. 1 and FIG. 2, according to an example embodiment.

FIG. 4 is example ECC memory circuit 400 including disclosed ECC hardware 110" for fault detection in both its read path and write path that essentially combines the read side and write side error checking embodiments described above relative to FIG. 1 and FIG. 2. Besides Mux 115a ECC memory circuit 400 includes a second Mux 120e having a first input for receiving read data from the memory circuit 400 in series with an input of the read Gen ECC logic 120b1 and a cross-coupled connection 150' for coupling the write data to the second input of the second MUX 120e. Here the digital comparator 135 is involved in both read side error checking and write side error checking.

In contrast to disclosed ECC memory circuits, for known ECC logic, the ECC logic is used only to detect and correct internal memory (e.g., RAM) errors. For ECC memory circuits having disclosed ECC logic, fault detection in the ECC logic is provided in addition to known detection and correction of internal memory errors, where any transient/permanent errors in the ECC computation and generation logic are also detected which enables corrective action to be taken. As described above, in the case of a lockstep error of the read Gen ECC 120$b_1$ (see FIG. 1), the single bit error can be corrected and a multi-bit error interrupt signal can be generated. In case of a lockstep logic in error in the write Gen ECC logic 115b (see FIG. 2), the write operation is repeated. Moreover, disclosed lockstep ECC circuit hardware is non-intrusive and can operate continuously (on every clock cycle, on-the fly) for checking memory ECC logic with only a limited area penalty in terms of additional Muxs and comparators.

Examples

Figure 5:
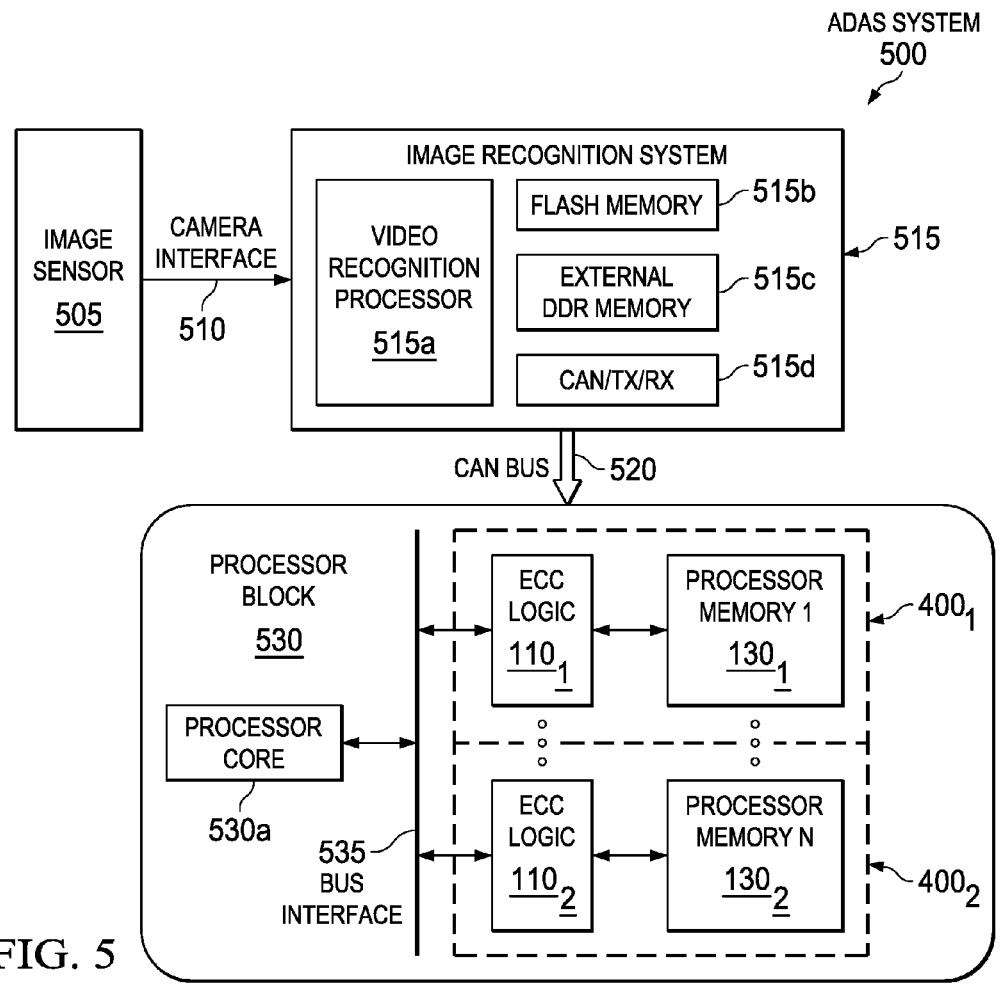
FIG. 5 is a system diagram of an example ADAS system including two instances of the disclosed ECC memory circuit shown in FIG. 4 as processor memory having disclosed lockstep ECC circuit hardware for fault detection in the ECC logic in its read path and write path, according to an example embodiment.

Disclosed embodiments are further illustrated by the following specific Examples, which should not be construed as limiting the scope or content of this Disclosure in any way. FIG. 5 is a system diagram of an example ADAS system 500 including two instances of the disclosed ECC memory circuit shown in FIG. 4 shown as 400$_1$ and 400$_2$ including processor memory 130$_1$ (shown as processor memory 1) and 130$_2$ (shown as processor memory N). The ECC memory circuits have disclosed lockstep ECC circuit hardware shown as ECC logic 110$_1$ and 110$_2$ for fault detection in the read path and write path of the processor memory. An image sensor 505 (e.g. a CMOS color camera) generates image data from a scene (e.g., from a rear-view from an automobile). The image data is coupled to an image recognition system 515 by a camera interface 510. Image recognition system 515 is shown including a video recognition processor 515a, flash memory 515b, external DDR memory 515c, and a controller area network (CAN) bus Tx/Rx (transceiver) 515d.

The image recognition system 515 is coupled by a CAN bus 520 to the processor block 530 that includes a processor core 530a. Processor core 530a is shown coupled by a bus interface 535 to utilize the processor memory 130$_1$ and 130$_2$ of ECC memory circuits 400$_1$ and 400$_2$. During operation of ADAS system 500, as described above ECC memory circuits 400$_1$ and 400$_2$ using disclosed lockstep ECC circuit hardware utilizing cross-coupled connections between the write path circuitry and read path circuitry enables the reuse of ECC generation logic on one side of the processor memory to check for errors on the other side reducing the ECC logic requirement and saving significant semiconductor chip area.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. Error correction code (ECC) hardware for a single port memory circuit, comprising:
   write path circuitry including write generation (Gen) ECC logic for generating first ECC bits from write data and for writing said first ECC bits and said write data to said memory circuit;
   read path circuitry including a check ECC block for coupling read data from said memory circuit comprising read Gen ECC logic coupled to an XOR circuit that has an input for coupling to an ECC output of said memory circuit, wherein an output of said XOR circuit provides a syndrome signal to a syndrome decode block coupled to a single bit error correction (SEC) block and for generating a multi-bit error detection (MED) interrupt signal;

a first multiplexer (MUX) having a first input for receiving said write data in series with an input to said write ECC generation logic or a second MUX having a first input for receiving said read data from said memory circuit in series with an input of said read Gen ECC logic;

a cross-coupling connector for coupling said read data from said memory circuit to a second input of said first MUX or a cross-coupling connector for coupling said write data to a second input of said second MUX, and an ECC bit comparator for comparing an output of said write Gen ECC logic to an output of said read Gen ECC logic.

2. The ECC hardware of claim 1, wherein an output of said comparator is coupled as an enable input to said syndrome decode block and as an enable input to said SEC block.

3. The ECC hardware of claim 1, wherein said ECC hardware and said single port memory circuit are formed on a common substrate having at least a semiconductor surface.

4. The ECC hardware of claim 1, wherein said ECC hardware includes said first MUX and said second MUX.

5. Error correction code (ECC) hardware for a single port memory circuit, comprising:

write path circuitry including write generation (Gen) ECC logic for generating first ECC bits from write data and for writing said first ECC bits and said write data to said memory circuit;

read path circuitry including a check ECC block for coupling read data from said memory circuit comprising read Gen ECC logic coupled to an XOR circuit that has an input for coupling to an ECC output of said memory circuit, wherein an output of said XOR circuit provides a syndrome signal to a syndrome decode block coupled to a single bit error correction (SEC) block and for generating a multi-bit error detection (MED) interrupt signal;

a first multiplexer (MUX) having a first input for receiving said write data in series with an input to said write ECC generation logic and a second MUX having a first input for receiving said read data from said memory circuit in series with an input of said read Gen ECC logic;

a cross-coupling connector for coupling said read data from said memory circuit to a second input of said first MUX and a cross-coupling connector for coupling said write data to a second input of said second MUX;

an ECC bit comparator for comparing an output of said write Gen ECC logic received to an output of said read Gen ECC logic.

6. The ECC hardware of claim 5, wherein an output of said comparator is coupled as an enable input to said syndrome decode block and as an enable input to said SEC block.

7. The ECC hardware of claim 5, wherein said ECC hardware and said single port memory circuit are formed on a common substrate having at least a semiconductor surface.

8. An Advanced Driver Assistance System (ADAS) system, comprising:

an image sensor for generating image data from a scene;

an image recognition system coupled to receive said image data from said image sensor including a video recognition processor and a transceiver;

a processor block including a processor core coupled to said image recognition system, said processor core coupled to utilize at least one ECC memory circuit that includes ECC memory hardware and single port processor memory;

said ECC memory hardware comprising:

write path circuitry including write generation (Gen) ECC logic for generating first ECC bits from write data and for writing said first ECC bits and said write data to said processor memory;

read path circuitry including a check ECC block for coupling read data from said processor memory comprising read Gen ECC logic coupled to an XOR circuit that has an input for coupling to an ECC output of said processor memory, wherein an output of said XOR circuit provides a syndrome signal to a syndrome decode block coupled to a single bit error correction (SEC) block and for generating a multi-bit error detection (MED) interrupt signal;

a first multiplexer (MUX) having a first input for receiving said write data in series with an input to said write ECC generation logic or a second MUX having a first input for receiving said read data from said processor memory in series with an input of said read Gen ECC logic;

a cross-coupling connector for coupling said read data from said memory circuit to a second input of said first MUX or a cross-coupling connector for coupling said write data to a second input of said second MUX, and an ECC bit comparator for comparing an output of said write Gen ECC logic to an output of said read Gen ECC logic.

9. The ADAS system of claim 8, wherein an output of said comparator is coupled as an enable input to said syndrome decode block and as an enable input to said SEC block.

10. The ADAS system of claim 8, wherein said ECC memory hardware and said processor memory are formed on a common substrate having at least a semiconductor surface.

11. The ADAS system of claim 8, wherein said ECC memory hardware includes said first MUX and said second MUX.

12. The ADAS system of claim 8, wherein said processor memory comprises a static random access memory (SRAM), read only memory (ROM), or a flash memory.

13. The ADAS system of claim 8, wherein said ECC memory hardware and said processor memory are formed on a common substrate having at least a semiconductor surface.

14. The ADAS system of claim 13, wherein common substrate and said semiconductor surface both comprise silicon.

15. The ADAS system of claim 8, wherein said image sensor comprises a color camera.

* * * * *